United States Patent
Carlson et al.

(10) Patent No.: US 9,927,471 B2
(45) Date of Patent: Mar. 27, 2018

(54) PEAK SHAVING USING ENERGY STORAGE

(71) Applicant: SolarCity Corporation, San Mateo, CA (US)

(72) Inventors: Eric Daniel Carlson, San Mateo, CA (US); Karthikeyan Varadarajan, Mountain View, CA (US)

(73) Assignee: SolarCity Corporation, San Mateo, CA (US)

( * ) Notice: Subject to any disclaimer, the term of this patent is extended or adjusted under 35 U.S.C. 154(b) by 583 days.

(21) Appl. No.: 14/095,709

(22) Filed: Dec. 3, 2013

(65) Prior Publication Data
US 2015/0153394 A1    Jun. 4, 2015

(51) Int. Cl.
| | |
|---|---|
| *G01R 21/133* | (2006.01) |
| *G05B 15/02* | (2006.01) |
| *H02J 3/32* | (2006.01) |
| *H02J 3/28* | (2006.01) |
| *H02J 3/30* | (2006.01) |
| *H02J 7/35* | (2006.01) |

(52) U.S. Cl.
CPC ......... *G01R 21/1331* (2013.01); *G05B 15/02* (2013.01); *H02J 3/32* (2013.01); *G05B 2219/2642* (2013.01); *H02J 3/28* (2013.01); *H02J 3/30* (2013.01); *H02J 7/35* (2013.01); *Y02B 70/3241* (2013.01); *Y04S 20/227* (2013.01)

(58) Field of Classification Search
CPC . G01R 21/1331; H02J 3/32; H02J 3/28; H02J 7/35; H02J 3/30; G05B 15/02
See application file for complete search history.

(56) References Cited

U.S. PATENT DOCUMENTS

| | | | |
|---|---|---|---|
| 5,414,640 A * | 5/1995 | Seem | H02J 3/14 307/35 |
| 2013/0285446 A1* | 10/2013 | Chow | H02J 3/32 307/18 |
| 2014/0094979 A1* | 4/2014 | Mansfield | H02J 3/383 700/291 |

\* cited by examiner

*Primary Examiner* — Carlos Ortiz Rodriguez
(74) *Attorney, Agent, or Firm* — Kilpatrick Townsend & Stockton LLP

(57) ABSTRACT

Techniques for controlling an energy storage device to reduce peak power demand at a site are provided. In one embodiment, instantaneous power usage at the site can be monitored, where the instantaneous power usage corresponds to power that is instantaneously imported or exported at a point of common coupling (PCC) between the site and a utility-managed energy grid. A historical power usage value for the site can then be calculated based on the monitored instantaneous power usage, and the historical power usage value can be compared with a target peak value plus a buffer value. If the historical power usage value exceeds the target peak value plus the buffer value, the target peak value can be set to the historical power usage value.

20 Claims, 10 Drawing Sheets

802 { FOR EACH *TIMESTEP*:

804 { $P_{TARGET} = \text{MAX}(P_{TARGET} + P_{DEADBAND}, \text{MAX } \overline{P_{PCC}})$;

806 { $P_{SHAVEMAX} = \text{MIN}(P_{SHAVEMAXRATED}, E_{STORAGE}/T_{RUNTIME})$;

808 { IF $\text{MAX}_{DEMANDINTERVAL} P_{PCC} > P_{TARGET}$

810 { $P_{SHAVE} = P_{SHAVEMAX}$;

812 { ELSE

814 { $P_{SHAVE} = \text{MIN}(P_{SHAVEMAX}, P_{LOAD} - P_{TARGET})$;

816 { END FOR

*FIG. 8*

PEAK SHAVING USING ENERGY STORAGE

BACKGROUND

Some electric utility customers, most commonly commercial and industrial customers, are billed two separate charges on their electricity service bill—a consumption charge and a peak demand charge. The consumption charge reflects the total amount of energy that the customer uses over the billing period. For example, if the customer's site consumes 1000 kilowatt-hours (kWh) at a cost of $0.07 per kWh, the customer's consumption charge will be 1000×$0.07, or $70. In contrast, the peak demand charge reflects the highest, or peak, amount of power demanded by the customer within the billing period. For example, if the customer's site reaches a peak power demand of 20 kilowatts (kW) at a cost of $8 per kW, the customer's peak demand charge will be 20×$8, or $160. In practice, utility companies usually average power demand over recurring "demand intervals" (e.g., every 15 minutes), and then use the highest demand interval average within the billing period to calculate the peak demand charge.

The rationale for a dual consumption/demand billing scheme is that the amount of power required by each customer over time can vary widely. For instance, some customers may need large bursts of electricity on an occasional basis, while others need lesser amounts constantly. As a result, utility companies must operate and maintain sufficient generation, transmission and distribution equipment (e.g., transformers, wires, substations, etc.) at all times in order to meet potential aggregate power demand during high demand periods, even if such equipment is under-utilized the rest of the time. These operational/maintenance costs are passed on to customers proportionally, based on their peak power requirements, in the form of the peak demand charge.

For customers that face a high peak demand charge each billing cycle, it can be economical to install an onsite energy storage system (e.g., a battery-based system) that performs "peak shaving." This means that the energy storage system discharges energy during intervals of high site load, thereby offsetting energy consumption from the utility grid and reducing, or shaving, the site's peak power demand. However, existing algorithms for controlling the flow of energy to/from such systems to achieve peak shaving (known as "peak shaving algorithms") generally suffer from a number of drawbacks. For instance, some peak shaving algorithms are implemented using complex predictive techniques (e.g., machine learning, neural networks, etc.) that are computationally expensive and thus are difficult to deploy/execute without expensive equipment. Other peak shaving algorithms can provide effective results in certain well-tested scenarios, but are "unstable" and thus may do a relatively poor job in reducing peak power demand in other, more general use cases. Accordingly, it would be desirable to have an improved peak shaving algorithm that addresses the deficiencies (e.g., high computational cost, poor robustness, etc.) of prior art solutions.

SUMMARY

Techniques for controlling an energy storage device to reduce peak power demand at a site are provided. In one embodiment, instantaneous power usage at the site can be monitored, where the instantaneous power usage corresponds to power that is instantaneously imported or exported at a point of common coupling (PCC) between the site and a utility-managed energy grid. A historical power usage value for the site can then be calculated based on the monitored instantaneous power usage, and the historical power usage value can be compared with a target peak value plus a buffer value. If the historical power usage value exceeds the target peak value plus the buffer value, the target peak value can be set to the historical power usage value.

The following detailed description and accompanying drawings provide a better understanding of the nature and advantages of particular embodiments.

BRIEF DESCRIPTION OF DRAWINGS

FIG. 8 is a pseudo-code implementation of the algorithm of FIGS. 7A and 7B according to an embodiment.

DETAILED DESCRIPTION

Figure 1:
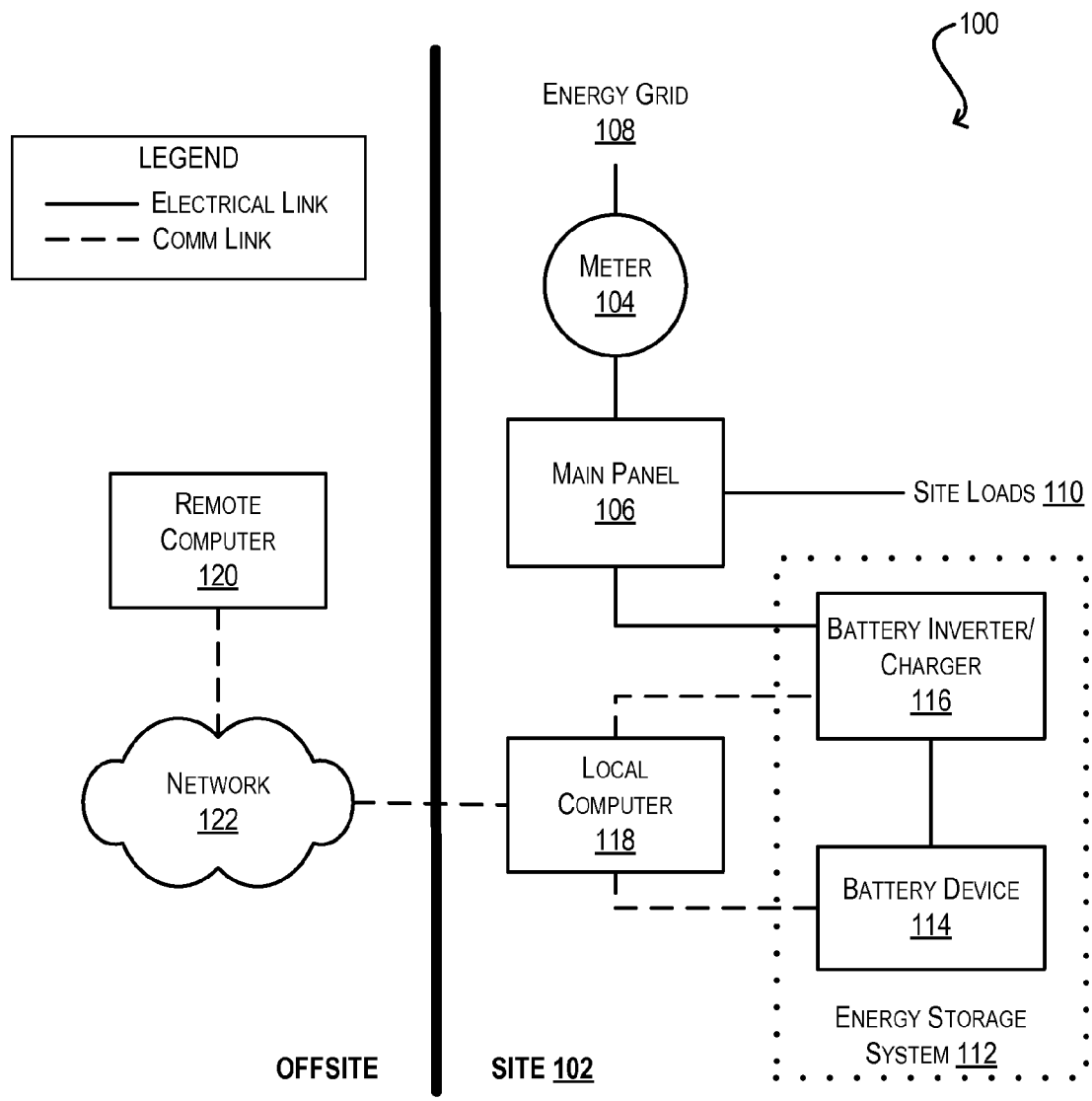
FIG. 1 is a simplified block diagram of a system environment according to an embodiment.

In the following description, for purposes of explanation, numerous examples and details are set forth in order to provide an understanding of various embodiments. It will be evident, however, to one skilled in the art that certain embodiments can be practiced without some of these details, or can be practiced with modifications or equivalents thereof.

1. Introduction

The present disclosure describes a novel algorithm (referred to herein as the "CV algorithm") for regulating the discharging and charging of an energy storage system to shave peak power demand at a site. In various embodiments, the CV algorithm can incorporate one or more of the following features (which are discussed in further detail in the sections that follow):

Ratcheting—Set a target peak value; if site power demand rises above the target peak value (after offset from the energy storage system), "ratchet up" the target peak value to meet the new site power demand Dead band—Maintain a buffer, or "dead band," above the target peak value; only raise the target peak value if the site power demand rises above the target peak value plus the dead band Roll-off—As the energy storage system becomes more depleted, reduce the power output from the energy storage system to extend its runtime Dispatch calculation—Discharge increments of energy from the energy storage system to offset a historical rolling demand average (based on a utility-defined demand interval) when the average is above the target peak value Taken together, the foregoing features allow for effective and efficient peak shaving, without incurring the disadvantages or drawbacks of prior art approaches. For example, by implementing the ratcheting, dead band, roll-off, and/or dispatch calculation features, the CV algorithm can determine when (and to what extent) to discharge the energy storage system in order to reduce the site's peak power demand for a billing period, without requiring any predictive foresight of what the site's power load over the billing period will be. Instead, the CV algorithm can operate solely based on current and short-term historical information. As a result, the algorithm is significantly less complex than prior art predictive algorithms that rely on, e.g., machine learning, neural networks, etc., and thus can be run on low-cost/ commodity hardware.

Further, due to its relative simplicity, the CV algorithm can be easily analyzed for performance/correctness, and can provide relatively good shaving results under a wide range of conditions. In certain embodiments, the CV algorithm can be combined with other algorithms in a layered, or hybrid, approach. For instance, an alternative peak shaving algorithm (e.g., a neural network-based algorithm) can be used to make an initial decision regarding whether, and how much, to discharge the energy storage system. The CV algorithm can then be applied in view of that initial decision (as, e.g., a set of constraints) to arrive at a final decision. In this manner, the CV algorithm can be used as a "backstop" to catch and correct poor decisions made by more complex, but possibly more unstable, algorithms.

2. Exemplary System Environment

FIG. 1 depicts a system environment 100 in which embodiments of the present invention may be implemented. As shown, system environment 100 includes a site 102 that comprises infrastructure (e.g., a meter 104 and a main panel 106) for importing energy from a utility-managed energy grid 108. The imported energy can be used to power one or more site loads 110. In one embodiment, meter 104 can be considered a "point of common coupling" (PCC) between energy grid 108 and site 102. The amount of power imported at the PCC at any given time is referred to as the site's instantaneous power demand.

Site 102 also includes an energy storage system 112 comprising a battery device 114 and a battery inverter/ charger 116. As discussed in the Background section, energy storage system 112 can be leveraged to perform peak shaving—in other words, battery inverter/charger 116 can discharge (i.e., dispatch) stored energy from battery device 114 in order to offset site 102's power demand during high demand periods. Furthermore, battery inverter/charger 116 can use energy that is imported from energy grid 108 to charge battery device 114 at times when site loads 110 are relatively low. Through this process, energy storage system 112 can potentially reduce the peak demand charge billed to the owner of site 102 each billing cycle.

To control its operation, energy storage system 112 can be communicatively coupled with a local controller, such as local computer 118. Local computer 118 can, among other things, execute one or more peak shaving algorithms (such as the CV algorithm described herein) for regulating the discharging/charging behavior of battery inverter/charger 116. Alternatively or in addition, energy storage system 112 can be communicatively coupled with an offsite controller, such as remote computer 120, via a network 122. In these embodiments, remote computer 120 can take over the duties of peak shaving calculation. In a particular embodiment, remote computer 120 can be configured to simultaneously execute peak shaving algorithms for a fleet of energy storage systems distributed at multiple sites.

It should be appreciated that system environment 100 is illustrative and not intended to limit embodiments of the present invention. For instance, although energy storage system 112 is depicted as a battery-based system, other types of energy storage technologies (e.g., compressed air, flywheels, pumped hydro, superconducting magnetic energy storage (SMES), etc.) may be used. Further, the various entities depicted in system environment 100 can have other capabilities or include other components/subcomponents that are not specifically described. For example, in certain embodiments, site 102 can include an energy generation system (e.g., a photovoltaic (PV) system) that is coupled with energy storage system 112. One of ordinary skill in the art will recognize many variations, modifications, and alternatives.

3. Exemplary Computer System

Figure 2:
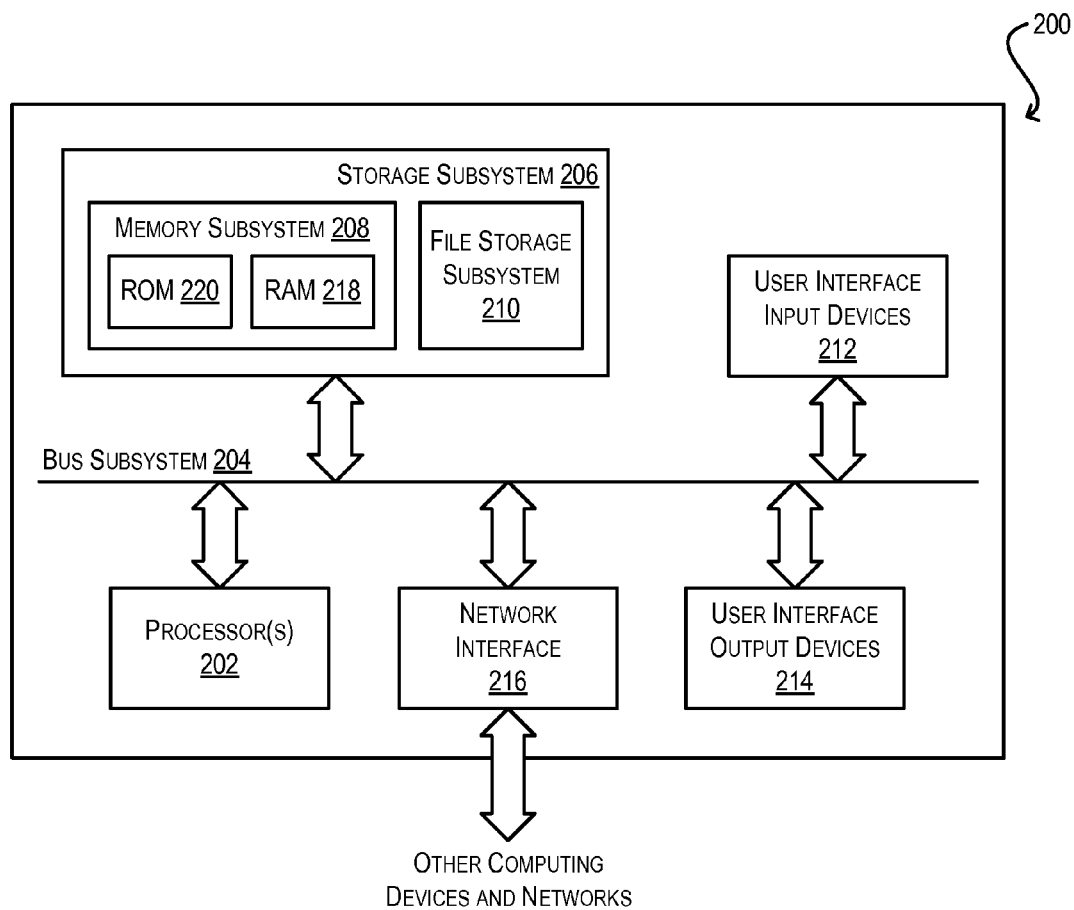
FIG. 2 is a simplified block diagram of a computer system according to an embodiment.

FIG. 2 depicts a computer system 200 according to an embodiment. Computer system 200 can be used to implement any of the computer systems/devices (e.g., local computer 118 or remote computer 120) described with respect to FIG. 1. As shown in FIG. 2, computer system 200 can include one or more processors 202 that communicate with a number of peripheral devices via a bus subsystem 204. These peripheral devices can include a storage subsystem 206 (comprising a memory subsystem 208 and a file storage subsystem 210), user interface input devices 212, user interface output devices 214, and a network interface subsystem 216.

Bus subsystem 204 can provide a mechanism for letting the various components and subsystems of computer system 200 communicate with each other as intended. Although bus subsystem 204 is shown schematically as a single bus, alternative embodiments of bus subsystem 204 can utilize multiple buses.

Network interface subsystem 216 can serve as an interface for communicating data between computer system 200 and other computer systems or networks (e.g., network 122 of FIG. 1). Embodiments of network interface subsystem 216 can include wired interfaces (e.g., Ethernet, CAN, RS232, RS485, etc.) or wireless interfaces (e.g., ZigBee, Wi-Fi, cellular, etc.).

User interface input devices 212 can include a keyboard, pointing devices (e.g., mouse, trackball, touchpad, etc.), a scanner, a barcode scanner, a touch-screen incorporated into a display, audio input devices (e.g., voice recognition systems, microphones, etc.), and other types of input devices. In general, use of the term "input device" is intended to include all possible types of devices and mechanisms for inputting information into computer system 200.

User interface output devices 214 can include a display subsystem, a printer, a fax machine, or non-visual displays such as audio output devices, etc. The display subsystem can be a cathode ray tube (CRT), a flat-panel device such as a liquid crystal display (LCD), or a projection device. In general, use of the term "output device" is intended to include all possible types of devices and mechanisms for outputting information from computer system 200.

Storage subsystem 206 can include a memory subsystem 208 and a file/disk storage subsystem 210. Subsystems 208 and 210 represent non-transitory computer-readable storage media that can store program code and/or data that provide the functionality of embodiments of the present invention.

Memory subsystem 208 can include a number of memories including a main random access memory (RAM) 218 for storage of instructions and data during program execution and a read-only memory (ROM) 220 in which fixed instructions are stored. File storage subsystem 210 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 200 is illustrative and not intended to limit embodiments of the present invention. Many other configurations having more or fewer components than computer system 200 are possible.

4. Algorithmic Features

As noted in the Introduction section, in various embodiments the CV algorithm can incorporate a combination of four features—ratcheting, dead band, roll-off, and dispatch calculation—that enable effective and efficient peak shaving. These features are described in the subsections below.

4.1 Ratcheting

At a high level, ratcheting involves the following series of steps:

1. Initialize a "target peak value" at the start of a billing period
2. If site power demand rises above the target peak value, discharge the energy storage system to offset the power being imported from the energy grid
3. If the discharging of the energy storage system cannot reduce site power demand down to the target peak value, "ratchet up" the target peak value to meet the new site power demand
4. Return to step (2); loop until the end of the billing period To better understand how this process works, consider graph 300 of FIG. 3, which illustrates an exemplary site load curve 302 and target peak curve 304 mapped against power (on the Y axis) and time (on the X axis). As shown, target peak curve 304 is initialized to a value of 50 kW at time A. Further, site load curve 302 (which is equivalent to site power demand when the energy storage system is not being discharged) starts at 40 kW at time A and gradually increases. The site load curve may represent an instantaneous power demand or the average power demand over a period of time (for example, 15 minutes).

At time B, site load curve 302 crosses the current target peak value of 50 kW. As a result, the energy storage system begins discharging energy to offset the power imported from the energy grid per step (2) above. This offset is depicted via arrows which show the site's power demand (which was previously equivalent to the site power load) being reduced down to the current target peak value (50 kW).

After time B, site load curve 302 continues to rise. At time C, site load curve 302 has risen to a point where the energy storage system does not have enough power to reduce site power demand down to the current target peak value of 50 kW. As a result, target peak curve 304 is ratcheted up to the new site power demand of (site load minus energy storage system offset) per step (3) above.

This ratcheting continues until target peak curve reaches 70 kW at time D, at which point site load curve 302 begins to fall (thereby allowing the energy storage system to fully offset site power demand down to the new target peak value of 70 kW). Target peak curve 304 remains at 70 kW for the remainder of this example (and will continue to stay at this level unless site load curve 302 again rises to a point where the energy storage system cannot fully offset site power demand down to 70 kW).

Figure 3:
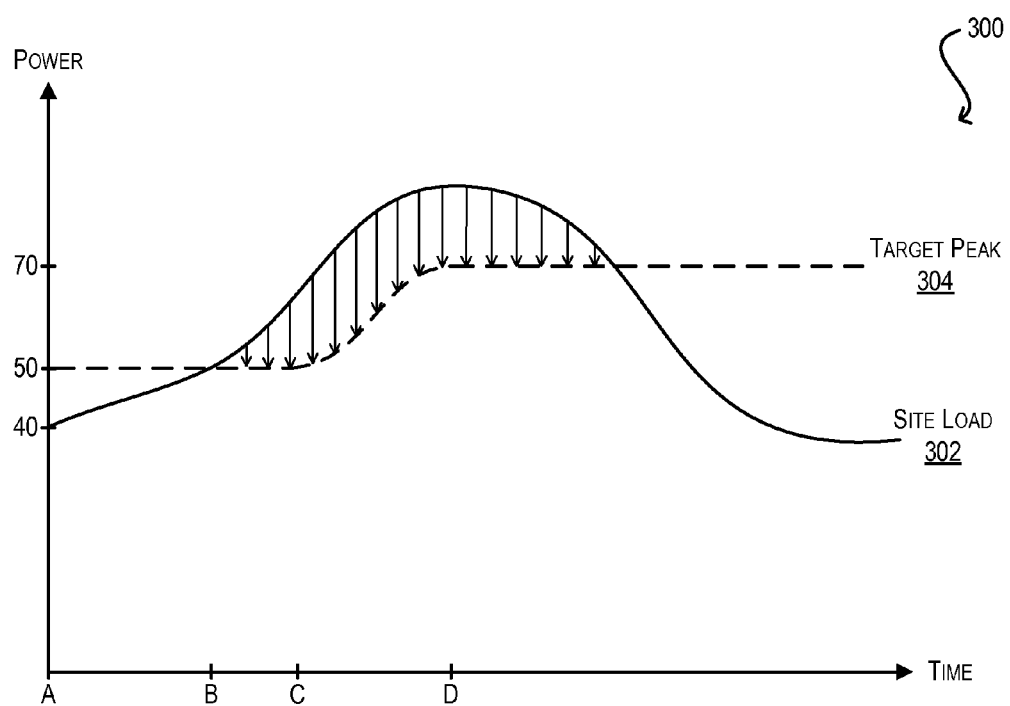
FIG. 3 is a graph depicting the algorithmic feature of "ratcheting" a target peak value according to an embodiment.

With the ratcheting shown in FIG. 3, the energy storage system can avoid discharging its energy source unless such discharging will reduce the highest power demand encountered so far during the billing period (as embodied by the target peak value). Accordingly, this increases the likelihood that the energy storage system will be able to shave the peak power demand for the billing period, without requiring prior knowledge of how site load curve 302 will behave. In one set of embodiments, the target peak value/curve can be compared against the site's instantaneous power demand (i.e., instantaneous power draw at the PCC) in order to determine when to discharge the energy storage system and when to ratchet the target peak value. In other embodiments, the target peak value/curve can be compared against a historical power usage/demand value (e.g., a demand average over a historical window). This alternative is discussed in further detail below.

4.2 Dead Band

The dead band feature is closely related to ratcheting and pertains to the manner in which the target peak value is ratcheted up to a higher value. When this feature is implemented, the target peak value is not raised immediately upon determining that the energy storage system cannot fully offset site power demand down to the current target peak (per step (3) above). Instead, a relatively small dead band, or buffer, is maintained above the target peak value, and the target peak value is only ratcheted when the site power demand exceeds the current target peak value plus the dead band.

Figure 4:
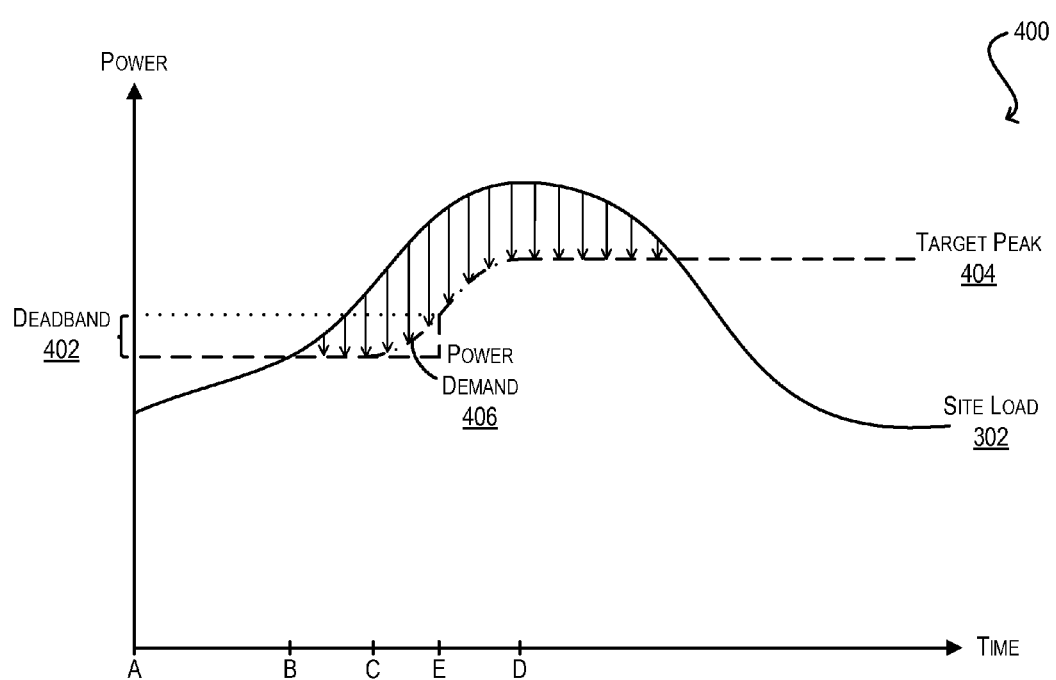
FIG. 4 is a graph depicting the algorithmic feature of implementing a "dead band" according to an embodiment.

This process is illustrated in graph 400 of FIG. 4, which depicts the same site load curve 302 of FIG. 3, as well as a dead band 402 above a new target peak curve 404. In the example of FIG. 4, target peak curve 404 remains flat at time C (i.e., the time at which target peak curve 304 is ratcheted in FIG. 3) because while the site power demand (406) has begun to rise, it has not yet exceeded the current target peak value plus dead band 402. At time E, site power demand 404 finally rises above the target peak value plus dead band 402, thereby causing target peak curve 404 to be ratcheted upward to match the new site power demand.

One reason why the dead band feature is a useful improvement over standard ratcheting is that there is typically some lag time between an actual increase in site power demand and the ability of the energy storage system to begin discharging. This may cause the standard ratcheting process to increase the target peak value even though the energy storage system is, in fact, capable of offsetting power demand down to the current target peak value (but simply has not responded quickly enough). If this scenario occurs multiple times over the course of a billing period, the target peak may be incorrectly raised above the actual peak demand for the period. Implementing a dead band as described above can avoid this since the energy storage system is given some time to "catch up" to the current site power demand before the target peak value is ratcheted.

In one embodiment, the size of the dead band can be determined empirically before the CV algorithm is executed at a particular site. For instance, a historical load curve for the site can be determined, and a number of simulations of the CV algorithm can be executed with respect to the historical load curve, with different dead band sizes. The dead band size that produces the best shaving results can then be selected for use during actual runs.

In alternative embodiments, the dead band may be dynamically determined/adjusted in real-time while the CV algorithm is executed on "live" demand/load data at the site.

4.3 Roll Off

Roll-off refers to the notion of adjusting the amount of power that is allowed to be discharged from the energy storage system based on its state of charge (SoC). Generally speaking, if the SoC is higher, a greater amount of power will be allowed to be discharged, and if the SoC is lower, a lesser amount of power will be allowed to be discharged.

This effectively extends the runtime of the energy storage system and increases the probability that the energy storage system will have energy available to shave the site's peak power demand for a billing period when that peak demand actually occurs.

Figure 5A:
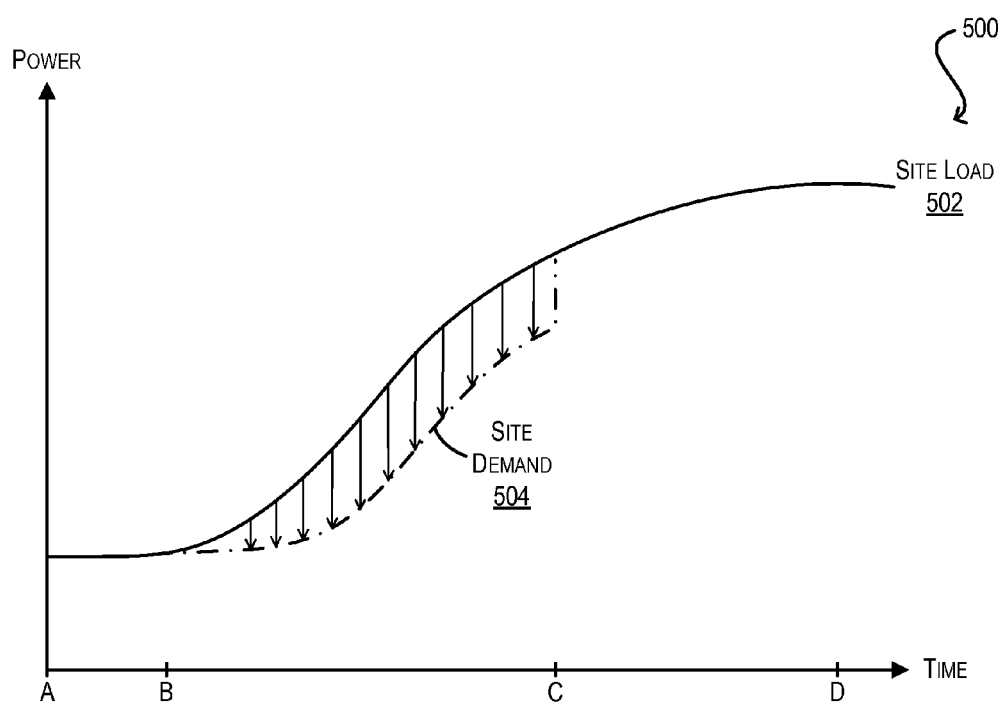
FIGS. 5A, 5B, and 6 are graphs depicting the algorithmic feature of "rolling off" the power output from an energy storage system according to an embodiment.

To illustrate this, FIG. 5A is a graph 500 that depicts an exemplary site load curve 502 and site demand curve 504 when the roll-off feature is not implemented. As shown, site load curve 502 and site demand curve 504 start out at the same level at time A. At time B, site load curve 502 begins to rise and the energy storage system is discharged at full power, thereby causing site demand curve 504 to rise at a slower pace since the site demand is now being offset by the energy storage system. Unfortunately, at time C, the energy storage system runs out of energy. As a result, site demand curve 504 jumps upward to match site load curve 502, and the energy storage system is ultimately unable to shave the peak demand for the billing period (which occurs at time D).

Figure 5B:
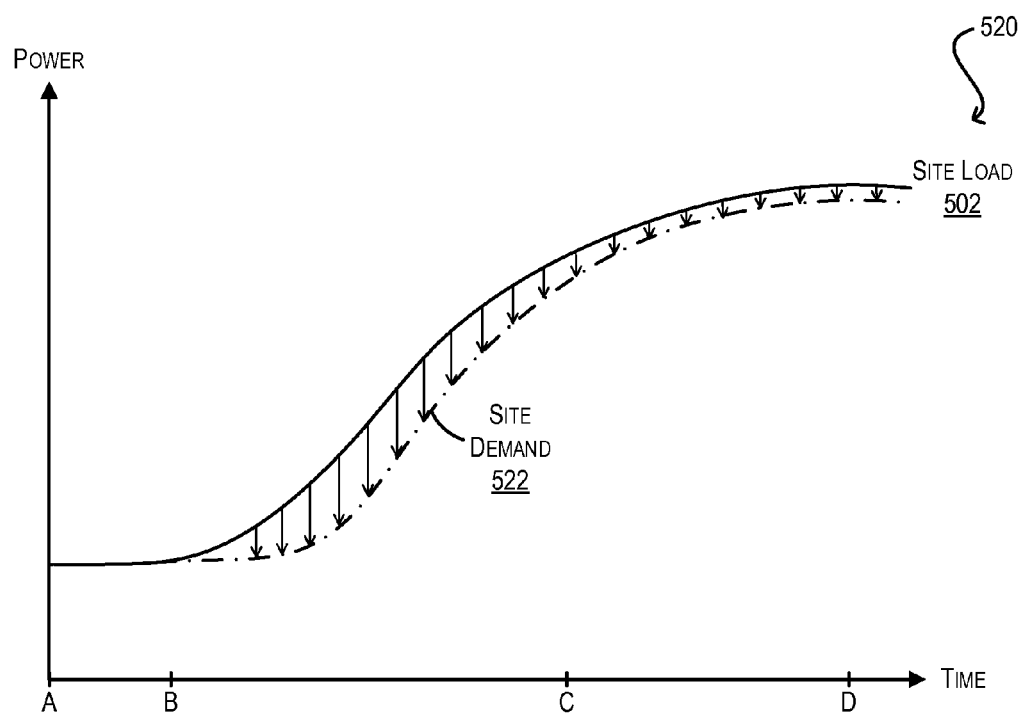

In contrast, FIG. 5B is a graph 520 that depicts the same site load curve 502 and a new site demand curve 522 when the roll-off feature is implemented. Like FIG. 5A, at time B of FIG. 5B, the energy storage system is discharged at full power in order to offset site load curve 502. However, rather than continuing to discharge at full power, the energy storage system gradually reduces, or rolls off, its output power over time (shown by the gradually reducing offset). This enables the energy storage system to extend its runtime long enough to offset the peak load/demand that occurs at time D.

Figure 6:
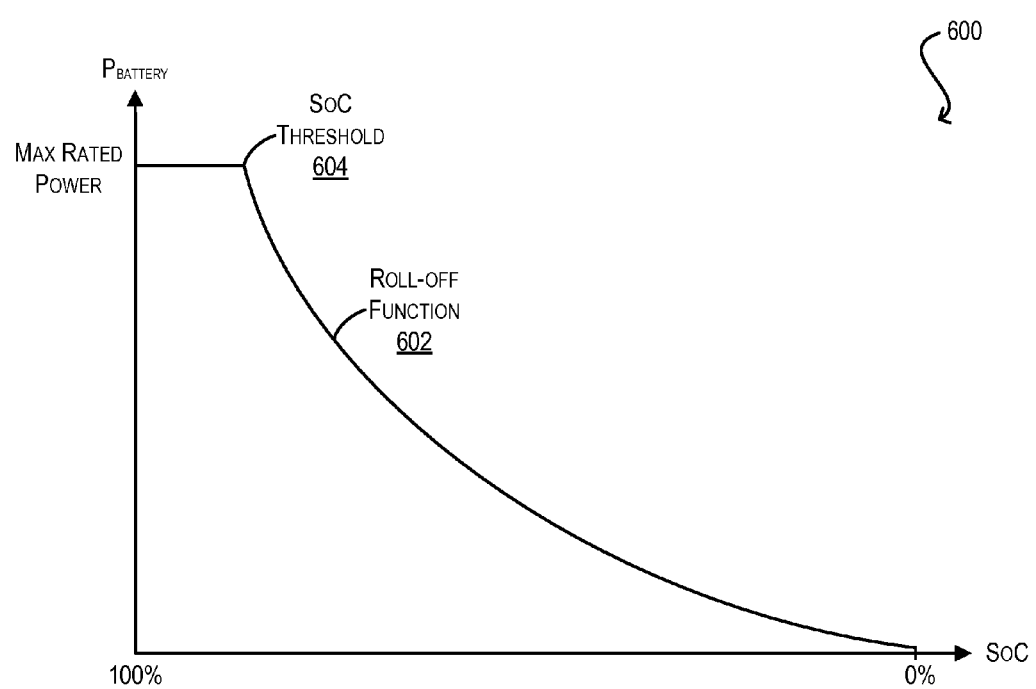

The particular manner in which the energy storage system rolls off its allowable output power can be defined as a function of the system's SoC as depicted in graph 600 of FIG. 6. In the example of FIG. 6, roll-off function 602 stays at full output power (i.e., the maximum rated power for the energy storage system) from full charge (i.e., 100% SoC) to a predefined SoC threshold 604. The allowable output power then falls off at an exponential rate until the energy storage system is fully depleted (i.e., reaches 0% SoC). With this type of roll-off function, SoC threshold 604 can be considered to control the "aggressiveness" of the algorithm. For instance, a lower SoC threshold will cause the energy storage system to more aggressively shave site power demand at the start, but will cause the system to deplete faster (and thus runs the risk of running out of energy if the site power demand continues to rise). On the other hand, a higher SoC threshold will not shave as much demand at the start, but will cause the energy storage system to last for a longer time during an extended continuously rising "hill" of demand (and thus may more effectively reduce the peak demand in such a scenario).

In other embodiments, alternative roll-functions that are different from roll-off function 602 of FIG. 6 may be used. For example, one such alternative function may decline in a linear fashion after the SoC threshold is reached. Another alternative function may not have any SoC threshold at all, or may have multiple SoC thresholds that define boundaries between multiple sub-functions within the roll-off function. One of ordinary skill in the art will recognize many variations, modifications, and alternatives.

4.4 Dispatch Calculation

The dispatch calculation feature builds upon aspects of the previous three concepts and refines the manner in which the CV algorithm determines when to discharge the energy storage system in order to maximally reduce the peak demand charge. Recall that utilities typically do not calculate the peak demand charge based on the highest instantaneous power demand within a billing period; instead, they determine average power demand over recurring demand intervals (e.g., every 15 minutes), and then use the highest demand interval average for the billing period as the site's peak demand.

This means that instantaneous power demand will not always be the best criterion for determining when to discharge the energy storage system. For instance, consider a 15 minute demand interval where instantaneous power demand rises high (e.g., above the target peak value) for the first 5 minutes, and then falls below the target peak value. In this case, if the energy storage system were controlled solely based on instantaneous power demand, the system would stop discharging after 5 minutes. However, it may be the case that the average power demand for the current demand interval is higher than any previous 15 minute average (due to, e.g., the sharp rise within the first 5 minutes). Accordingly, it may be beneficial to continue discharging the system further into the demand interval (even if instantaneous power demand has fallen below the target peak value) in order to bring the overall demand interval average down.

To account for the foregoing scenario (and other similar scenarios), the dispatch calculation feature constantly attempts to lower a power demand value that is based on a historical, rolling window, where the window is based on the utility-defined demand interval. This increases the likelihood that the highest demand interval average for the billing period (rather than simply the highest instantaneous power demand) will be shaved.

In a particular embodiment, when this feature is enabled, the CV algorithm can determine an average power demand value for each of a number of measurement intervals, where each measurement interval corresponds to a window from the current time to a past time within the immediately preceding demand interval. By way of example, if the demand interval is 15 minutes, the CV algorithm may calculate an average power demand value for a first interval from the current time back 1 minute, a second interval from the current time back 2 minutes, a third interval from the current time back 3 minutes, and so on up to a fifteenth interval from the current time back 15 minutes, resulting in 15 separate averages. The CV algorithm can then check whether any of these averages is greater than the current target peak value; if so, the energy storage system can be discharged. In one embodiment, the energy storage system can be discharged at its maximum allowable power until the next algorithmic time step (per the roll-off function described in section 4.3 above). In another embodiment, the energy storage system can be discharged at a power that is proportional to the maximum value over all intervals of the product of a measurement interval time, and the difference between the interval average demand and the target peak. This can be represented as:

$$P = k \times \max((\mathrm{IntervalDemand}(i) - \mathrm{TargetPeak}) \times \mathrm{TimeOfAveragingInterval}(i))$$

In the equation above, k is a constant, IntervalDemand(i) is the average demand computed for the i-th measurement interval, TargetPeak is the target peak value, and TimeOfAveragingInterval(i) is the averaging time used for interval i.

In other embodiments, the energy storage system can be discharged to the extent needed to bring the maximum demand interval average down to the current target peak value.

If none of the calculated averages are greater than the target peak value, the energy storage system can either be charged or discharged based on the site's instantaneous power demand.

5. The CV Algorithm

Figure 7A:
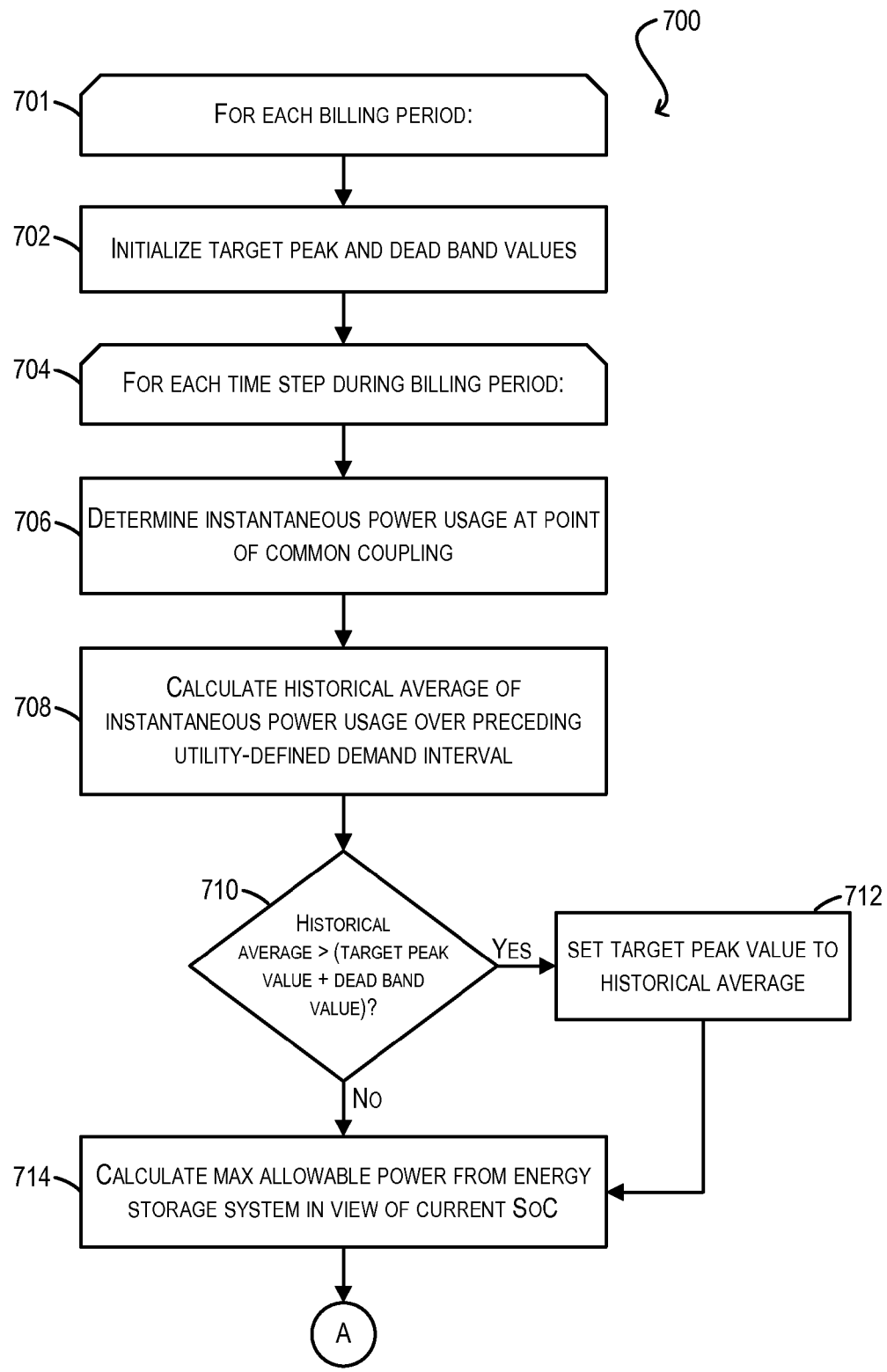
FIGS. 7A and 7B are flowcharts depicting a peak shaving algorithm according to an embodiment.
Figure 7B:
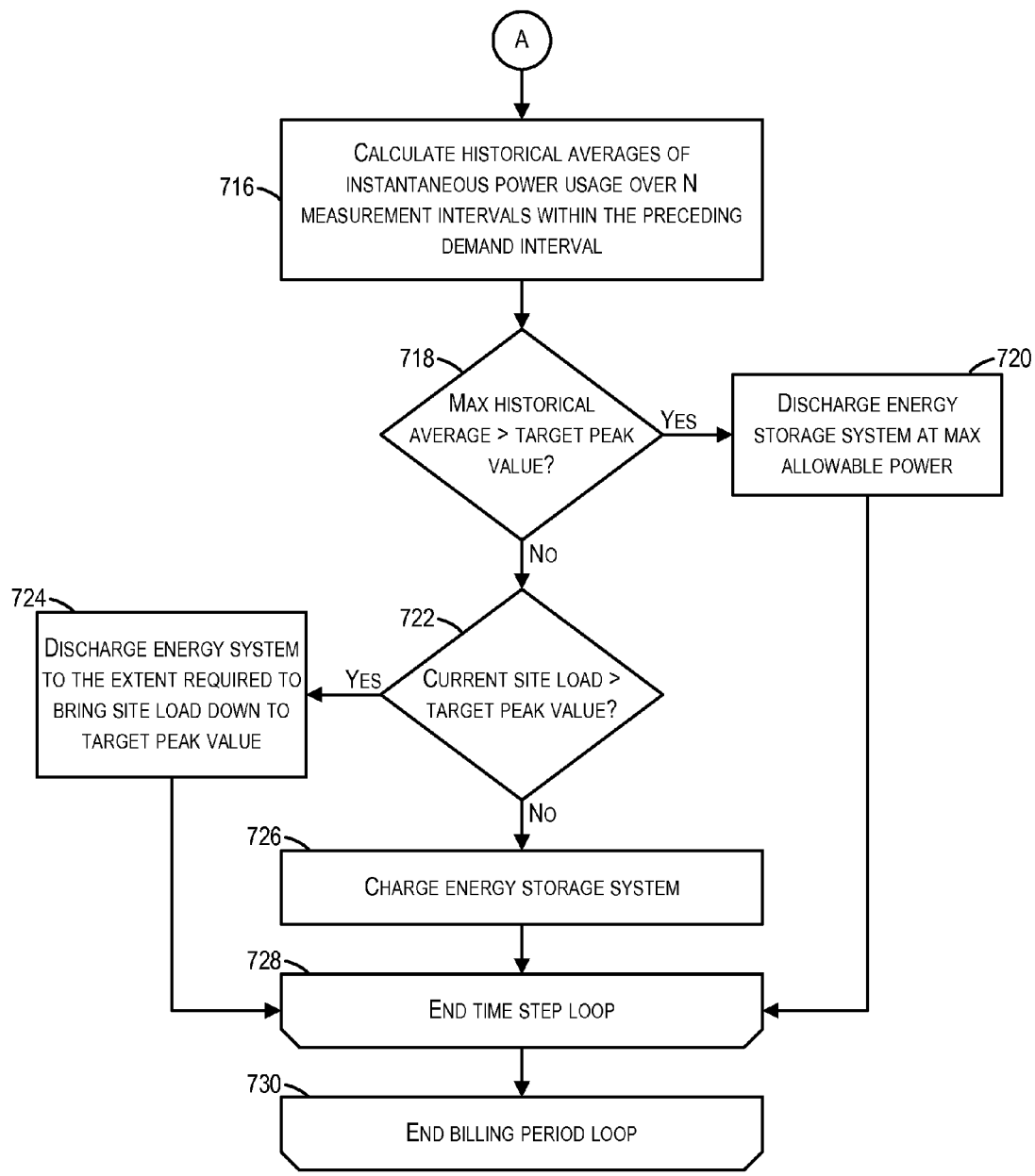

With the foregoing features in mind, FIGS. 7A and 7B depict a flowchart 700 of the CV algorithm according to an embodiment. In the following description, flowchart 700 is described as being executed by local computer 118 for the purpose of controlling energy storage system 112 of FIG. 1. However, flowchart 700 may also be executed by remote computer 120 or any other computing device that is in communication with system 112.

Starting with FIG. 7A, at block 701, local computer 118 can enter a loop for each billing period. At block 702, local computer 118 can initialize a target peak value and a dead band (i.e., buffer) value for the current billing period. As noted previously, these values can be determined empirically or via a dynamic mechanism.

Upon initializing the target peak and dead band values, local computer 118 can enter a loop for each algorithmic time step within the billing period (block 704). Since the CV algorithm is an iterative algorithm, these time steps reflect the intervals at which local computer 118 executes the iterations of the algorithm. Each time step can be set to, e.g., 10 seconds, 30 seconds, 1 minute, 5 minutes, or any other user-defined value.

Within the loop of block 704, local computer 118 can first determine the current instantaneous power usage, or demand, at the site's PCC and calculate a historical average of the instantaneous power usage over a preceding utility-defined demand interval (blocks 706 and 708). For example, if the demand interval is 15 minutes, local computer 118 can calculate a historical average of instantaneous power usage over the past 15 minutes. Local computer 118 can then compare the historical average calculated at block 708 with the current target peak value plus dead band value (block 710). If the target peak value plus dead band value is exceeded, local computer 118 can ratchet up the target peak value to match the historical average (block 712).

Further, at block 714, local computer 118 can calculate a maximum amount of power that can be discharged from energy storage system 112 (i.e., "max allowable power") based on system 112's current SoC. In one embodiment, this can comprise invoking a roll-off function as described in section 4.3 above.

Turning now to FIG. 7B, at block 716, local computer 118 can calculate historical averages of instantaneous power usage/demand over N measurement intervals in the preceding demand interval. For instance, per the example noted in section 4.4, if the demand interval is 15 minutes and each algorithmic time step is 1 minute, local computer 118 can calculate 15 different averages, where each average reflects average power usage from the current time back N minutes (N=1 to 15).

Once these historical averages are computed, local computer 118 can determine whether the largest, or max, historical average exceeds the target peak value. If so, local computer 118 can instruct energy storage system 112 to discharge energy at the max allowable power determined at block 714 (block 720) and the current loop iteration can end (block 728).

If not, local computer 118 can move on to comparing the current site load versus the target peak value (block 722). If the current site load exceeds the target peak value, local computer 118 can instruct energy storage system 112 to discharge energy to the extent required to bring the site load down below the target peak value (block 724); otherwise, local computer 118 can instruct energy storage system 112 to charge itself (block 726). The current time step loop iteration can subsequently end (block 728) and the loop of block 704 can repeat until the end of the billing period is reached (block 730). The entire process can then be iterated for subsequent billing periods.

To further illustrate the operation of the CV algorithm, FIG. 8 depicts an exemplary pseudo-code implementation 800 of the algorithm according to an embodiment. The variables used in this implementation are defined as follows:

$P_{target}$—Target peak value $P_{deadband}$—Dead band value $P_{ppc}$—Rolling demand interval average of instantaneous power usage/demand at the PPC $P_{shavemax}$—Maximum allowable power of the energy storage system given its current SoC $P_{shavemaxrated}$—Maximum rated power of the energy storage system $E_{storage}$—Total amount of stored energy in the energy storage system $T_{runtime}$—Target runtime of the energy storage system $Max_{demandinterval}P_{ppc}$—Maximum demand average over N measurement intervals within the immediately preceding demand interval; in one embodiment, this variable can be calculated as follows:

$$\max\left(\frac{\sum_{i=now}^{n} E_i}{\Delta T_{now\text{-}n}}\right)$$

where $E_n = P_n \times \Delta t_n$

In the equations above, $P_n$ corresponds to the instantaneous power usage/demand at measurement interval n and $\Delta t_n$ corresponds to the length of measurement interval n. Thus, $E_n$ is the total amount of energy consumed during interval n and $Max_{demandinterval}P_{ppc}$ is the max power usage across all values of n (i.e., 1 to N).

$P_{shave}$—Instantaneous power output of the energy storage system; positive values represent power output, and negative values represent charging (if the system is capable of charging)

$P_{load}$—Power of the site load, not including offset from the energy storage system At line 802 of listing 800, a FOR loop is initiated for each time step of the current billing period. At line 804, the target peak value is calculated as the maximum of (current target peak value plus dead band value) and the maximum rolling demand interval average of power usage/demand. Thus, the target peak value is ratcheted up if the maximum rolling demand interval average exceeds the current target peak plus dead band.

At line 806, the maximum allowable power from the energy storage system is calculated as the minimum of the maximum rated power of the system and the current storage level divided by target runtime. This reduces the allowable power in a linear fashion as the SoC of the energy storage system decreases.

Finally, at lines 808-814, the maximum demand average over N measurement intervals in the preceding demand interval is calculated and compared to the target peak value. If the maximum average exceeds the target peak value, the energy storage system is discharged at its maximum allowable power. Otherwise, the power output from the energy storage system is calculated as the minimum of the maximum allowable power and the difference between the current site load and the target peak value. Note that, if the site load is greater than the target peak value, the power output calculated at line 814 will be a positive value, which means the energy storage system will be discharged. On the other hand, if the site load is less than the target peak value, the power output may be a negative value, which means the energy storage system may be charged. In this case, the amount of charge will correspond to the difference between $P_{load}$ and $P_{target}$, which ensures that the charging will not cause site power demand to exceed the target peak value.

The above description illustrates various embodiments of the present invention, along with examples of how aspects of the embodiments may be implemented. These examples and embodiments should not be deemed to be the only embodiments, and are presented to illustrate the flexibility and advantages of the present invention as defined by the following claims. For example, although certain embodiments have been described with respect to particular flowcharts and steps, it should be apparent to those skilled in the art that the scope of the present invention is not strictly limited to the described flowcharts and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the invention as set forth in the following claims.

What is claimed is:

1. A method comprising:
   monitoring, by a computer system, instantaneous power usage at a site, the instantaneous power usage corresponding to power that is instantaneously imported or exported at a point of common coupling (PCC) between the site and a utility-managed energy grid;
   calculating, by the computer system, a first historical power usage value for the site based on the monitored instantaneous power usage, wherein the first historical power usage value is an average of the monitored instantaneous power usage over a time window;
   comparing, by the computer system, the first historical power usage value with a target peak value that corresponds to an estimated peak power demand;
   in response to the first historical power usage value exceeding the target peak value, increasing, by the computer system, the target peak value to the first historical power usage value; and
   controlling a charging and discharging of an energy storage device coupled to the site to reduce a peak power demand at the site based on the target peak value.

2. The method of claim 1 wherein the first historical power usage value is a maximum average of the monitored instantaneous power usage over a rolling time window.

3. The method of claim 1 wherein the rolling time window is a time interval that the utility uses to determine a peak demand charge for the site.

4. The method of claim 3 wherein the rolling time window corresponds to fifteen minutes.

5. The method of claim 1 wherein the buffer value is determined empirically based on the site's historical power load.

6. The method of claim 1 further comprising calculating a maximum allowable power output value for the energy storage device, wherein the maximum allowable power output value decreases as a state of charge of the energy storage device decreases.

7. The method of claim 6 wherein the maximum allowable power output value is calculated using a function that takes as input a maximum rated power of the energy storage device, a total amount of stored energy in the energy storage device, and a target runtime for the energy storage device.

8. The method of claim 7 wherein calculating the maximum allowable power output value comprises taking the lesser of:
   the maximum rated power; and
   the total amount of stored energy divided by the target runtime.

9. The method of claim 6 further comprising calculating a second historical power usage value for the site, the calculating of the second historical power usage value comprising:
   for each of a plurality of measurement time intervals of the instantaneous power usage over an immediately preceding time window, computing an average amount of power imported at the site for the measurement time interval; and
   selecting the highest average amount across the plurality of measurement time intervals.

10. The method of claim 9 further comprising, when the second historical power usage value is greater than the target peak value, discharging the energy storage device in accordance with either:
    the maximum allowable power output value; or
    a power value that is proportional to a maximum of, for each measurement time interval in the plurality of measurement time intervals:
    a product of a time range of the measurement interval; and
    the difference between an average demand for the time measurement interval and the target peak value.

11. The method of claim 10 further comprising, when the second historical power usage value is less than or equal to the target peak value, discharging the energy storage device in accordance with the lesser of:
    the maximum allowable power output value; and
    a current power load of the site minus the target peak value.

12. The method of claim 11 wherein, when the current power load minus the target peak value is a negative value, the energy storage device is charged in accordance with the negative value.

13. A system comprising:
    a processor configured to:
    monitor instantaneous power usage at a site, the instantaneous power usage corresponding to power that is instantaneously imported or exported at a PCC between the site and a utility-managed energy grid;
    calculate a first historical power usage value for the site based on the monitored instantaneous power usage, wherein the first historical power usage value is an average of the monitored instantaneous power usage over a time window;

compare the first historical power usage value with a target peak value that corresponds to an estimated peak power demand;

in response to the first historical power usage value exceeding the target peak value, increase the target peak value to the first historical power usage value; and control a charging and discharging of an energy storage device coupled to the site to reduce a peak power demand at the site based on the target peak value.

14. The system of claim 13 wherein the processor is further configured to calculate a maximum allowable power output value for the energy storage device, wherein the maximum allowable power output value decreases as a state of charge of the energy storage device decreases.

15. The system of claim 14 wherein the processor is further configured to calculate a second historical power usage value for the site, the calculating of the second historical power usage value comprising:

for each of a plurality of measurement time intervals of the instantaneous power usage over an immediately preceding time window, computing an average amount of power imported at the site for the measurement time interval; and selecting the highest average amount across the plurality of measurement time intervals.

16. The system of claim 15 wherein the processor is further configured to:

when the second historical power usage value is greater than the target peak value, discharge the energy storage device in accordance with either:

the maximum allowable power output value; or a power value that is proportional to a maximum of, for each measurement time interval in the plurality of measurement time intervals:

a product of a time range of the measurement interval and the difference between an average demand for the time measurement interval and the target peak value; and when the second historical power usage value is less than or equal to the target peak value, discharge or charge the energy storage device in accordance with the lesser of:

the maximum allowable power output value; and a current power load of the site minus the target peak value.

17. A non-transitory computer readable storage medium having stored thereon program code executable by a processor, the program code comprising:

code that causes the processor to monitor instantaneous power usage at a site, the instantaneous power usage corresponding to power that is instantaneously imported or exported at a PCC between the site and a utility-managed energy grid;

code that causes the processor to calculate a first historical power usage value for the site based on the monitored instantaneous power usage, wherein the first historical power usage value is an average of the monitored instantaneous power usage over a time window;

code that causes the processor to compare the first historical power usage value with a target peak value that corresponds to an estimated peak power demand;

in response to the first historical power usage value exceeding the target peak value, code that causes the processor to increase the target peak value to the first historical power usage value; and code that causes the processor to control a charging and discharging of an energy storage device coupled to the site to reduce a peak power demand at the site based on the target peak value.

18. The non-transitory computer readable storage medium of claim 17 wherein the program code further comprises code that causes the processor to calculate a maximum allowable power output value for the energy storage device, wherein the maximum allowable power output value decreases as a state of charge of the energy storage device decreases.

19. The non-transitory computer readable storage medium of claim 18 wherein the program code further comprises code that causes the processor to calculate a second historical power usage value for the site, the calculating of the second historical power usage value comprising:

for each of a plurality of measurement time intervals of the instantaneous power usage over an immediately preceding time window, computing an average amount of power imported at the site for the measurement time interval; and selecting the highest average amount across the plurality of measurement time intervals.

20. The non-transitory computer readable storage medium of claim 19 wherein the program code further comprises code that causes the processor to:

when the second historical power usage value is greater than the target peak value, discharge the energy storage device in accordance with either:

the maximum allowable power output value; or a power value that is proportional to a maximum of, for each measurement time interval in the plurality of measurement time intervals:

a product of a time range of the measurement interval and the difference between an average demand for the time measurement interval and the target peak value; and when the second historical power usage value is less than or equal to the target peak value, discharge or charge the energy storage device in accordance with the lesser of:

the maximum allowable power output value; and a current power load of the site minus the target peak value.

* * * * *